United States Patent
Huang

(10) Patent No.: US 9,685,203 B2
(45) Date of Patent: Jun. 20, 2017

(54) POWER SUPPLY VOLTAGE SWITCHING CIRCUIT CAPABLE OF PREVENTING CURRENT LEAKAGE

(71) Applicant: eMemory Technology Inc., Hsin-Chu (TW)

(72) Inventor: Kuo-Chun Huang, Chiayi (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/260,325

(22) Filed: Sep. 9, 2016

(65) Prior Publication Data

US 2017/0077920 A1    Mar. 16, 2017

Related U.S. Application Data

(60) Provisional application No. 62/216,378, filed on Sep. 10, 2015.

(51) Int. Cl.
| | | |
|---|---|---|
| *H03L 5/00* | (2006.01) | |
| *G11C 5/10* | (2006.01) | |
| *H01L 27/112* | (2006.01) | |
| *G11C 17/16* | (2006.01) | |
| *G11C 17/18* | (2006.01) | |
| *G11C 11/24* | (2006.01) | |
| *G11C 5/06* | (2006.01) | |
| *G11C 7/06* | (2006.01) | |
| *G11C 7/10* | (2006.01) | |
| *G11C 7/12* | (2006.01) | |

(Continued)

(52) U.S. Cl.
CPC ............... *G11C 5/10* (2013.01); *G11C 5/06* (2013.01); *G11C 7/06* (2013.01); *G11C 7/10* (2013.01); *G11C 7/12* (2013.01); *G11C 11/24* (2013.01); *G11C 17/16* (2013.01); *G11C 17/18* (2013.01); *H01L 27/11206* (2013.01); *H03K 17/161* (2013.01); *H03K 19/018507* (2013.01)

(58) Field of Classification Search
CPC .......... H03K 3/356; H03K 19/018521; H03K 19/00315; H03K 17/102; H03K 3/012; H03K 17/161; H03K 19/018507; G11C 5/10; G11C 5/06; G11C 7/06; G11C 7/12; G11C 11/24; G11C 17/16; H01L 27/11206
USPC .................. 327/306, 333; 326/61–62, 80–81
See application file for complete search history.

(56) References Cited

U.S. PATENT DOCUMENTS

| | | |
|---|---|---|
| 7,215,043 B2 | 5/2007 | Tsai |
| 7,423,472 B2 | 9/2008 | Hirose |
| 7,701,245 B1 | 4/2010 | Vasudevan |

(Continued)

*Primary Examiner* — Dinh T Le
(74) *Attorney, Agent, or Firm* — Winston Hsu

(57) ABSTRACT

A power supply voltage switching circuit includes a power selecting module, a level shifting module, and a supply switching module. The power selecting module receives a first supply signal and a second supply signal, and outputs an intermediate supply signal according to the first supply signal and the second supply signal. The level shifting module receives the intermediate supply signal as a power supply, and generates a first shifted signal and a second shifted signal by shifting voltage levels of a first control signal and a second control signal respectively. The supply switching module receives the first supply signal and a third supply signal, and generates an output signal according to the first shifted signal, the second shifted signal, the first control signal, and the second control signal.

12 Claims, 2 Drawing Sheets

(51) Int. Cl.
*H03K 17/16* (2006.01)
*H03K 19/0185* (2006.01)

(56) References Cited

U.S. PATENT DOCUMENTS 8,749,292 B2 * 6/2014 Priel ................ H03K 19/01852
326/62
8,786,371 B2 * 7/2014 Popplewell ........... H03F 1/0227
330/146
8,922,247 B2 * 12/2014 Myers ................ G06F 17/5068
326/83

* cited by examiner

POWER SUPPLY VOLTAGE SWITCHING CIRCUIT CAPABLE OF PREVENTING CURRENT LEAKAGE

CROSS REFERENCE TO RELATED APPLICATIONS

This non-provisional application claims priority of U.S. provisional application No. 62/216,378, filed on Sep. 10, 2015, included herein by reference in its entirety.

BACKGROUND OF THE INVENTION

1. Field of the Invention

This invention relates to a power supply voltage switching circuit, and more particularly, a power supply voltage switching circuit capable of preventing current leakage.

2. Description of the Prior Art

As the integrated circuit technology grows more and more complicate, the requirement of power supply for the integrated circuit also grows. Therefore, power supply for different voltages has been used in many applications, such as non-volatile flash memory. The different voltages may be used for operations in different modes.

FIG. 1 shows a conventional power supply voltage switching circuit 100 according to prior art. The power supply voltage switching circuit 100 includes a level shifting module 110 and a supply switching module 120. The level shifting module 110 includes two level-shifters 112 and 114 for respectively shifting levels of the control signals ENA and ENB to generate shifted signals ENA' and ENB'. The voltages of the shifted signals ENA' and ENB' are determined by the power supply voltage of the level-shifters 112 and 114. The selecting switch module 120 includes two P-type transistors 122 and 124. The transistor 122 and the transistor 124 receive different voltages VPP and VPR. The voltage VPP may be a charge pumped high voltage used for a program operation of the non-volatile flash memory, while the voltage VPR may be a rather low operational voltage used for a read operation of the non-volatile flash memory. Also, the transistors 122 and 124 are controlled by different shifted signals ENA' and ENB'; therefore, by generating the control signals ENA and ENB and shifting levels of the control signals ENA and ENB properly, the shifted signals ENA' and ENB' can be used to turn on or turn off the transistors 122 and 124 and further control the power supply voltage switching circuit 100 to output the desired voltage $V_o$.

For example, to output the voltage VPR, the control signal ENB may be at a rather low voltage VSS, and the control signal ENA may be at a regular system operational voltage VDD greater than the voltage VSS. In this case, the shifted signal ENB' would be at the low voltage VSS, and the voltage of the shifted signal ENA' would be shifted to a voltage near the power supply voltage of the level-shifter 112, that is the voltage VPP. Therefore, the transistor 124 would be turned on and the transistor 122 would be turned off. The turned-on transistor 124 would output the selected voltage VPR. For some systems, the voltage VPP may be 7V, the voltage VDD may be 3.3V, and the voltage VPR may be 1.8V.

However, as the applications vary, the voltages received by the level shifting module 110 and the supply switching module 120 may also vary for operations of different modes. For convenience of switching suitable voltages, the power supply voltage of the level shifting module 110 may be generated by a voltage selecting module. For example, in some situation, the transistor 122 may receive the voltage VDD instead of the voltage VPP. The level shifting module 110 would select the voltage VDD as the power supply voltage for the level shifting module 110. However, the power supply voltage may be a little lower than the voltage VDD due to the limitation of the voltage selecting module. Therefore, according to the aforementioned process, when outputting the voltage VPR, the shifted signal ENA' would be at a voltage slightly lower than the voltage VDD. In this case, the shifted signal ENA' may not be able to turn off the transistor 122, and the leakage current may flow from the transistor 122 to the transistor 124. Since the non-volatile flash memory may be operated in a high speed, this kind of leakage current can be hard to predict and can cause lots of power consumption. Therefore, how to reduce current leakage has been a critical issue to be solved.

SUMMARY OF THE INVENTION

One embodiment of the present invention discloses a power supply voltage switching circuit. The power supply voltage switching circuit includes a power selecting module, a level shifting module, and a supply switching module.

The power selecting module receives a first supply signal and a second supply signal, and outputs an intermediate supply signal according to the first supply signal and the second supply signal.

The level shifting module is coupled to the power selecting module for receiving the intermediate supply signal as a power supply of the level shifting module. The level shifting module receives a first control signal and a second control signal, and generates a first shifted signal and a second shifted signal by shifting voltage levels of the first control signal and the second control signal respectively.

The supply switching module includes a first transistor, a second transistor, a third transistor, and a fourth transistor. The first transistor has a first terminal for receiving the first supply signal, a second terminal, and a control terminal for receiving the first control signal. The second transistor has a first terminal coupled to the second terminal of the first transistor, a second terminal coupled to an output terminal of the power supply voltage switching circuit, and a control terminal for receiving the first shifted signal. The third transistor has a first terminal for receiving a third supply signal, a second terminal, and a control terminal for receiving the second control signal. The fourth transistor has a first terminal coupled to the second terminal of the third transistor, a second terminal coupled to the output terminal of the power supply voltage switching circuit, and a control terminal for receiving the second shifted signal.

The first supply signal has a voltage between a first voltage and a second voltage, the second supply signal has a voltage between the first voltage and a third voltage, and the third supply signal has a voltage between the first voltage and a fourth voltage. The second voltage is greater than the third voltage, the third voltage is greater than the fourth voltage, and the fourth voltage is greater than the first voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
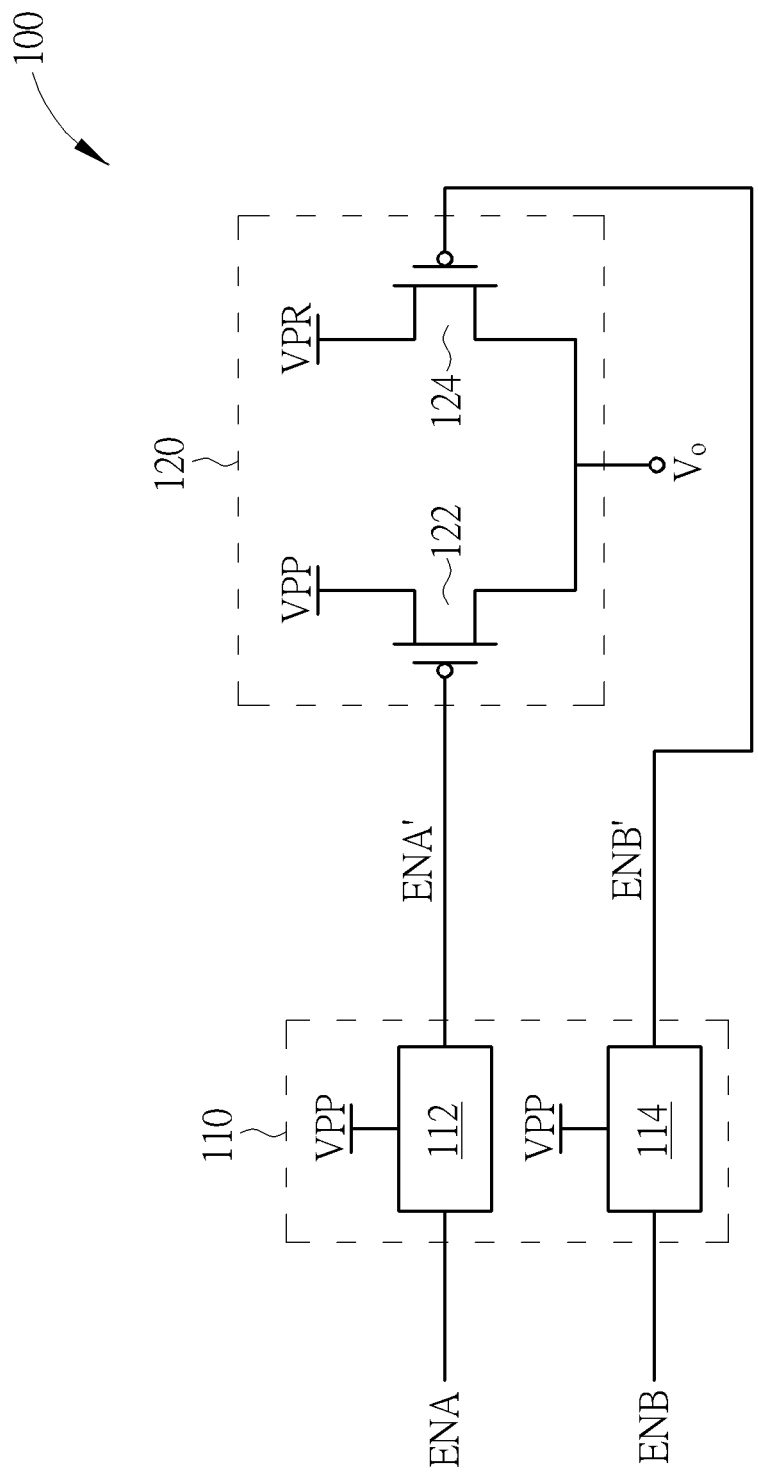
FIG. 1 shows a conventional power supply voltage switching circuit according to prior art.
Figure 2:
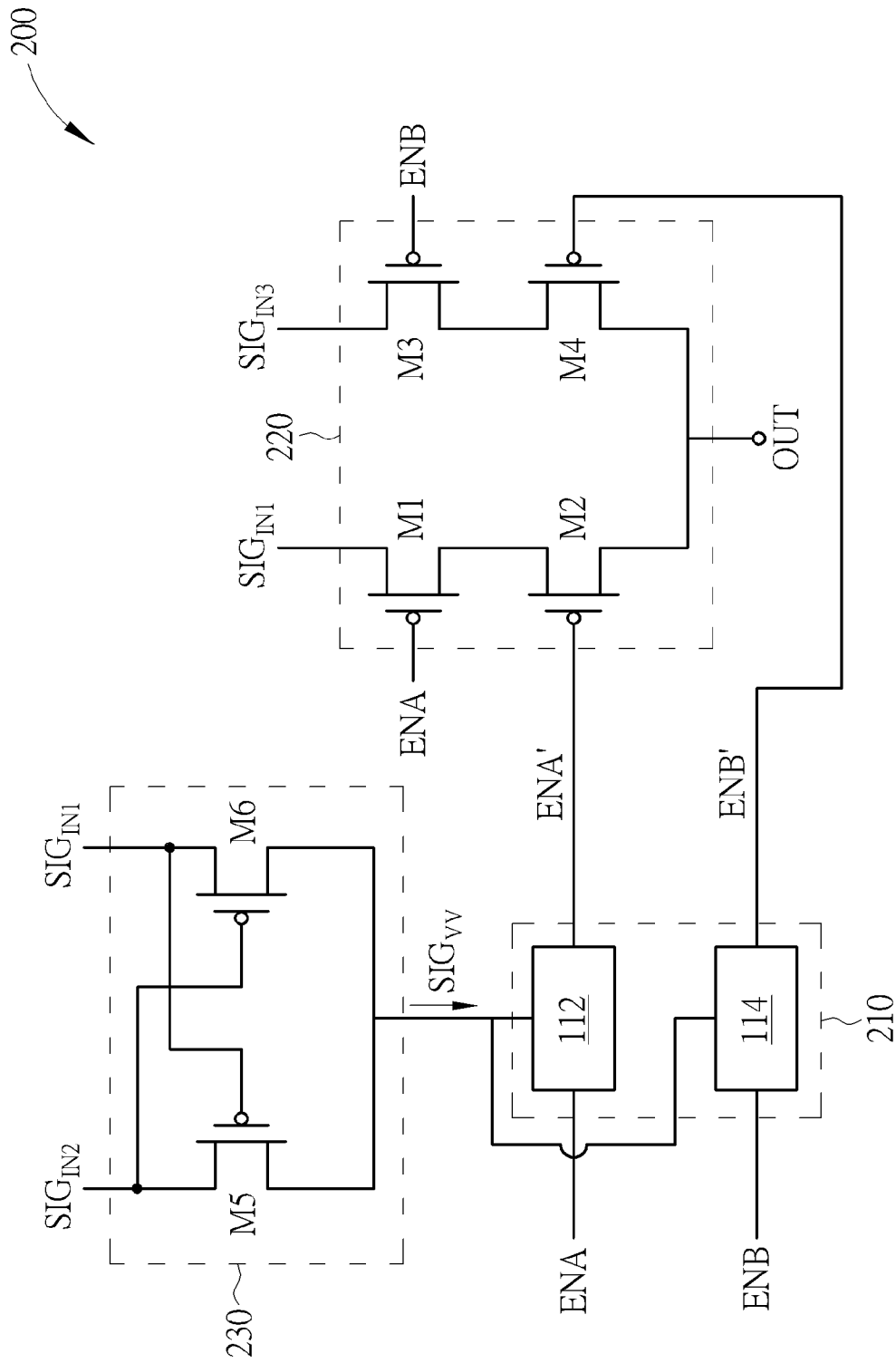
FIG. 2 shows a power supply voltage switching circuit according to one embodiment of the present invention.

FIG. 2 shows a power supply voltage switching circuit 200 according to one embodiment of the present invention. The power supply voltage switching circuit 200 includes a level shifting module 210, a supply switching module 220, and a power selecting module 230. The level shifting module 210 receives a first control signal ENA and a second control signal ENB, and generates a first shifted signal ENA' and a second shifted signal ENB' by shifting voltage levels of the first control signal ENA and the second control signal ENB respectively. The first control signal ENA, the second control signal ENB, the first shifted signal ENA' and the second shifted signal ENB' can be used to control the supply switching module 220 to output the desired voltage. Also, the power selecting module 230 can provide the power supply for the level shifting module 210.

Since the power supply voltage switching circuit 200 may be used to provide different levels of voltages for operations in different modes, the level shifting module 210 may also require different power supply voltages in different modes. Therefore, the power selecting module 230 can receive different supply signals, such as the first supply signal $SIG_{IN1}$ and the second supply signal $SIG_{IN2}$, and output an intermediate supply signal $SIG_{VV}$ according to the first supply signal $SIG_{IN1}$ and the second supply signal $SIG_{IN2}$. To simplify the control signal, the power selecting module 230 may be designed to output voltage by automatically comparing the first supply signal $SIG_{IN1}$ and the second supply signal $SIG_{IN2}$ and selecting the one having a greater voltage to generate the intermediate supply signal $SIG_{VV}$.

In FIG. 2, the supply switching module 220 includes a first transistor M1, a second transistor M2, a third transistor M3, and a fourth transistor M4. The first transistor M1, the second transistor M2, the third transistor M3, and the fourth transistor M4 may be P-type transistors. The first transistor M1 has a first terminal for receiving the first supply signal $SIG_{IN1}$, a second terminal, and a control terminal for receiving the first control signal ENA. The second transistor M2 has a first terminal coupled to the second terminal of the first transistor M1, a second terminal coupled to an output terminal OUT of the power supply voltage switching circuit 200, and a control terminal for receiving the first shifted signal ENA'. The third transistor M3 has a first terminal for receiving a third supply signal $SIG_{IN3}$, a second terminal, and a control terminal for receiving the second control signal ENB. The fourth transistor M4 has a first terminal coupled to the second terminal of the third transistor M3, a second terminal coupled to the output terminal OUT of the power supply voltage switching circuit 200, and a control terminal for receiving the second shifted signal ENB'.

In some embodiments of the present invention, the first supply signal $SIG_{IN1}$ has a voltage between a first voltage VSS and a second voltage VPP, the second supply signal $SIG_{IN2}$ has a voltage between the first voltage VSS and a third voltage VDD, and the third supply signal $SIG_{IN3}$ has a voltage between the first voltage VSS and a fourth voltage VPR. The first voltage VSS may be a system base voltage. The second voltage VPP may be a charge pumped high voltage used for the program operations of the non-volatile memory. The third voltage VDD maybe a system regular voltage. The fourth voltage VPR may be a rather low voltage used for the read operations of the non-volatile memory. In some embodiments, the second voltage VPP may be greater than the third voltage VDD, the third voltage VDD may be greater than the fourth voltage VPR, and the fourth voltage VPR may be greater than the first voltage VSS. For example, the first voltage VSS may be the ground voltage, the second voltage VPP may be 7V, the third voltage VDD may be 3.3V, and the fourth voltage VPR may be 1.8V.

Furthermore, the power selecting module 230 includes a fifth transistor M5 and a sixth transistor M6. The fifth transistor M5 and the sixth transistor M6 are P-type transistors. The fifth transistor M5 has a first terminal for receiving the second supply signal $SIG_{IN2}$, a second terminal coupled to the level shifting module 210, and a control terminal for receiving the first supply signal $SIG_{IN1}$. The sixth transistor M6 has a first terminal for receiving the first supply signal $SIG_{IN1}$, a second terminal coupled to the second terminal of the fifth transistor M5, and a control terminal for receiving the second supply signal $SIG_{IN2}$. Furthermore, an N-well body of the fifth transistor M5 can be coupled to the second terminal of the fifth transistor M5, and an N-well body of the sixth transistor M6 can be coupled to the second terminal of the sixth transistor M6.

Therefore, when the first supply signal $SIG_{IN1}$ is at the second voltage VPP, and the second supply signal $SIG_{IN2}$ is at the third voltage VDD, the fifth transistor M5 would be turned off and the sixth transistor M6 would be turned on. In this case, the power selecting module 230 would output first supply signal $SIG_{IN1}$. Similarly, when the voltage of the first supply signal $SIG_{IN1}$ is lower than the voltage of the second supply signal $SIG_{IN2}$, the fifth transistor M5 would be turned on and the sixth transistor M6 would be turned off. Consequently, the power selecting module 230 would output the second supply signal $SIG_{IN2}$.

The level shifting module 210 is coupled to the power selecting module 230 and receives the intermediate supply signal $SIG_{VV}$ as the power supply of the level shifting module 210. In some embodiments of the present invention, the level shifting module 210 can shift the voltages of the first control signal ENA and the second control signal ENB up to the voltage of the power supply, that is, the intermediate supply signal $SIG_{VV}$. Furthermore, since the first shifted signal ENA' is generated by shifting the voltage level of the first control signal ENA by the level shifting module 210, the first shifted signal ENA' and the first control signal ENA should be in phase. Similarly, the second shifted signal ENB' and the second control signal ENB should also be in phase.

For example, when the first control signal ENA is at the third voltage VDD, the first shifted signal ENA' generated by the level shifting module 210 is at a voltage substantially equal to the voltage of the intermediate supply signal $SIG_{VV}$. When the first control signal ENA is at the first voltage VSS, the first shifted signal ENA' generated by the level shifting module is at the first voltage VSS. Similarly, when the second control signal ENB is at the third voltage VDD, the second shifted signal ENB' generated by the level shifting module 210 is at a voltage substantially equal to the voltage of the intermediate supply signal $SIG_{VV}$. When the second control signal ENB is at the first voltage VSS, the second shifted signal ENB' generated by the level shifting module is at the first voltage VSS.

In some embodiments, the first control signal ENA and the second control signal ENB can be generated by a control circuit. The control circuit may output the first control signal ENA and the second control signal ENB to control the supply switching module 220 to output the desired voltage according to the different modes. For example, during a first mode of the power supply voltage switching circuit 200, the first control signal ENA can be at the first voltage VSS, the second control signal ENB can be at the third voltage VDD. In this case, if the first supply signal $SIG_{IN1}$ is at the second voltage VPP, and the second supply signal $SIG_{IN2}$ is at the third voltage VDD, then the first shifted signal ENA' would be at the first voltage VSS, and the second shifted signal ENB' would be at the second voltage VPP. Therefore, the first transistor M1 and the second transistor M2 will be turned on, and the third transistor M3 and the fourth transistor M4 will be turned off. Consequently, the output terminal OUT of power supply voltage switching circuit 200 may output the first supply signal $SIG_{IN1}$ at the second voltage VPP to trigger the program operations of the non-volatile memory.

Similarly, during a second mode of the power supply voltage switching circuit 200, the first control signal ENA can be at the third voltage VDD, and the second control signal ENB can be at the first voltage VSS. In this case, if the first supply signal $SIG_{IN1}$ is at the second voltage VPP, and the second supply signal $SIG_{IN2}$ is at the third voltage VDD, then the first shifted signal ENA' would be at the second voltage VPP, and the second shifted signal ENB' would be at the first voltage VSS. Therefore, the first transistor M1 and the second transistor M2 will be turned off, and the third transistor M3 and the fourth transistor M4 will be turned on. Consequently, the output terminal OUT of power supply voltage switching circuit 200 may output the third supply signal $SIG_{IN3}$ to trigger the read operations of the non-volatile memory.

In addition, during a third mode of the power supply voltage switching circuit 200, the first control signal ENA can be at the third voltage VDD, and the second control signal ENB can be at the third voltage VDD. In this case, if the first supply signal $SIG_{IN1}$ is at the second voltage VPP, and the second supply signal $SIG_{IN2}$ is at the third voltage VDD, then the first shifted signal ENA' and the second shifted signal ENB' would be at the second voltage VPP. Therefore, the first transistor M1 and the second transistor M2 will be turned off. The third transistor M3 may be turned on but the fourth transistor M4 will be turned off. Consequently, the output terminal OUT of power supply voltage switching circuit 200 may be floating for the standby mode of the non-volatile memory.

In the aforementioned modes, the power supply voltage switching circuit 200 is operated with the first supply signal $SIG_{IN1}$ being at the second voltage VPP and the second supply signal $SIG_{IN2}$ being at the third voltage VDD. However, the first supply signal $SIG_{IN1}$ may be changed according to the system operations. For example, the first supply signal $SIG_{IN1}$ may be at the third voltage VDD while the second supply signal $SIG_{IN2}$ is at the third voltage VDD for some temporary or special occasions. Or, the first supply signal $SIG_{IN1}$ may be a litter higher than the second supply signal $SIG_{IN2}$ at the third voltage VDD, but not higher than the second supply signal $SIG_{IN2}$ plus a threshold voltage $V_t$ of the fifth transistor M5 or the sixth transistor M6. Or, the similar case when the second supply signal $SIG_{IN2}$ is a litter higher than the first supply signal $SIG_{IN1}$.

In these cases, the fifth transistor M5 and the sixth transistor M6 may both be turned off. However, since the N-well body of the fifth transistor M5 is coupled to the second terminal of the fifth transistor M5 and the N-well body of the sixth transistor M6 is coupled to the second terminal of the sixth transistor M6, the intermediate supply signal $SIG_{VV}$ would be generated by the source to body forward bias of these two transistors. Therefore, the intermediate supply signal $SIG_{VV}$ would be at a voltage a little lower than the third voltage VDD, for example, the third voltage VDD minus the threshold voltage $V_t$ of the fifth transistor M5 or the sixth transistor M6, that is, VDD-$V_t$.

If the power supply voltage switching circuit 200 is operated in the aforesaid second mode, then the first control signal ENA can be at the third voltage VDD, and the second control signal ENB can be at the first voltage VSS. Therefore, the first shifted signal ENA' would be at a voltage slightly less than the third voltage VDD, and the second shifted signal ENB' would be at the first voltage VSS. Consequently, the third transistor M3 and the fourth transistor M4 may be turned on. However, the second transistor M2 may be difficult to be turned off since the intermediate supply signal $SIG_{VV}$ is lower than the third voltage VDD by the threshold voltage of the transistor in the power selecting module 230. Although the same situation may cause current leakage in prior art, the first transistor M1 of the supply switching module 220 can be turned off to prevent the current leakage since the control terminal of the first transistor M1 receives the first control signal ENA at the third voltage VDD. That is, with the supply switching module 220, the power supply voltage switching circuit 200 can be operated with different voltages without leaking current.

In summary, according to the power supply voltage switching circuit provided by the embodiments of the present invention, the supply switching module of the power supply voltage switching circuit can be controlled by the first control signal, the second control signal, the first shifted signal, and the second shifted signal. Therefore, when the supply signals received by the power supply voltage switching circuit are switching between different voltages for different modes, the current leakage caused in the prior art can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power supply voltage switching circuit comprising:
   a power selecting module configured to receive a first supply signal and a second supply signal, and output an intermediate supply signal according to the first supply signal and the second supply signal;
   a level shifting module coupled to the power selecting module for receiving the intermediate supply signal as a power supply of the level shifting module, and configured to receive a first control signal and a second control signal, and generate a first shifted signal and a second shifted signal by shifting voltage levels of the first control signal and the second control signal respectively; and
   a supply switching module comprising:
      a first transistor having a first terminal configured to receive the first supply signal, a second terminal, and a control terminal configured to receive the first control signal;
      a second transistor having a first terminal coupled to the second terminal of the first transistor, a second terminal coupled to an output terminal of the power supply voltage switching circuit, and a control terminal configured to receive the first shifted signal;
      a third transistor having a first terminal configured to receive a third supply signal, a second terminal, and a control terminal configured to receive the second control signal; and a fourth transistor having a first terminal coupled to the second terminal of the third transistor, a second terminal coupled to the output terminal of the power supply voltage switching circuit, and a control terminal configured to receive the second shifted signal; wherein:

the first supply signal has a voltage between a first voltage and a second voltage;

the second supply signal has a voltage between the first voltage and a third voltage;

the third supply signal has a voltage between the first voltage and a fourth voltage;

the second voltage is greater than the third voltage;

the third voltage is greater than the fourth voltage; and the fourth voltage is greater than the first voltage.

2. The power supply voltage switching circuit of claim 1, wherein the first transistor, the second transistor, the third transistor, and the fourth transistor are P-type transistors.

3. The power supply voltage switching circuit of claim 1, wherein the power selecting module comprises:

a fifth transistor having a first terminal configured to receive the second supply signal, a second terminal coupled to the level shifting module, and a control terminal configured to receive the first supply signal; and a sixth transistor having a first terminal configured to receive the first supply signal, a second terminal coupled to the second terminal of the fifth transistor, and a control terminal configured to receive the second supply signal.

4. The power supply voltage switching circuit of claim 3, wherein the fifth transistor and the sixth transistor are P-type transistors.

5. The power supply voltage switching circuit of claim 4, wherein an N-well body of the fifth transistor is coupled to the second terminal of the fifth transistor, and an N-well body of the sixth transistor is coupled to the second terminal of the sixth transistor.

6. The power supply voltage switching circuit of claim 1, wherein during a first mode of the power supply voltage switching circuit, the first control signal is at the first voltage,
the first shifted signal is at the first voltage,
the second control signal is at the third voltage,
the second shifted signal is at a voltage substantially equal to a voltage of the intermediate supply signal, and
the output terminal of power supply voltage switching circuit outputs the first supply signal.

7. The power supply voltage switching circuit of claim 1, wherein during a second mode of the power supply voltage switching circuit, the first control signal is at the third voltage,
the first shifted signal is at a voltage substantially equal to a voltage of the intermediate supply signal,
the second control signal is at the first voltage,
the second shifted signal is at the first voltage, and
the output terminal of power supply voltage switching circuit outputs the third supply signal.

8. The power supply voltage switching circuit of claim 1, wherein during a third mode of the power supply voltage switching circuit, the first control signal is at the third voltage,
the first shifted signal is at a voltage substantially equal to a voltage of the intermediate supply signal,
the second control signal is at the third voltage,
the second shifted signal is at a voltage substantially equal to the voltage of the intermediate supply signal, and
the output terminal of power supply voltage switching circuit is floating.

9. The power supply voltage switching circuit of claim 1, wherein when the first control signal is at the third voltage, the first shifted signal generated by the level shifting module is at a voltage substantially equal to a voltage of the intermediate supply signal.

10. The power supply voltage switching circuit of claim 1, wherein when the first control signal is at the first voltage, the first shifted signal generated by the level shifting module is at the first voltage.

11. The power supply voltage switching circuit of claim 1, wherein when the second control signal is at the third voltage, the second shifted signal generated by the level shifting module is at a voltage substantially equal to a voltage of the intermediate supply signal.

12. The power supply voltage switching circuit of claim 1, wherein when the second control signal is at the first voltage, the second shifted signal generated by the level shifting module is at the first voltage.

* * * * *